United States Patent [19]

Agrawal et al.

[11] Patent Number: 5,257,268
[45] Date of Patent: Oct. 26, 1993

[54] COST-FUNCTION DIRECTED SEARCH METHOD FOR GENERATING TESTS FOR SEQUENTIAL LOGIC CIRCUITS

[75] Inventors: Prathima Agrawal; Vishwani D. Agrawal, both of New Providence, N.J.; Kwang T. Cheng, Berkeley, Calif.

[73] Assignee: AT&T Bell Laboratories, Murray Hill, N.J.

[21] Appl. No.: 497,824

[22] Filed: Mar. 22, 1990

Related U.S. Application Data

[63] Continuation of Ser. No. 182,001, Apr. 15, 1988, abandoned.

[51] Int. Cl.$^5$ .............................................. G01R 31/28
[52] U.S. Cl. ........................................ 371/27; 371/23
[58] Field of Search ................................. 371/23, 27

[56] References Cited

U.S. PATENT DOCUMENTS

| | | | |
|---|---|---|---|
| 3,961,250 | 6/1976 | Snethen | 324/73 R |
| 4,204,633 | 5/1980 | Goel | 371/27 |
| 4,601,032 | 7/1986 | Robinson | 371/23 |
| 4,692,921 | 9/1987 | Dahbura et al. | 371/27 |

OTHER PUBLICATIONS

Jones, E. et al., "Automatic Test Generation Methods for Large Scale Integrated Logic", IEEE Journal of Solid-State Circuits, vol. SC-2, No. 4, Dec. 1967, pp. 221–226.

Seshu, S. et al., "The Diagnosis of Asynchronous Sequential Switching Systems", IRE Trans. on Electronic Computers, vol. EC-11, Aug. 1962, pp. 459–465.

Seshu, S., "On an Improved Diagnosis Program", IEEE Trans. on Electronic Computers, vol. EC-14, Feb. 1965, pp. 76–79.

Breuer, M., "A Random and an Algorithmic Technique for Fault Detection Test Generation for Sequential Circuits", IEEE Trans. on Computers, Nov. 1971, pp. 1364–1370.

Hill, F. et al., "SCIRTSS: A Search System for Sequential Circuit Test Sequences", IEEE Trans. on Computers, May 1977, pp. 490–502.

Miczo, A., Digital Logic Testing and Simulation, copyright 1986 by Harper & Row, Publishers, Inc., pp. 28–43.

Kirkland, T. et al., "Algorithms for Automatic Test Generation", IEEE Design & Test, Jun. 1988, pp. 43–55.

Bruer, M., "New Concepts in Automated Testing of Digital Circuits", in Computer-Aided Design of Digital Electronic Circuits and Systems, Musgrave, G. ed., North-Holland Pub. Co., 1979, pp. 57–80.

Verma, J. et al., "Automatic Test-Generation and Test-Verification of Digital Systems", Proc. 11th Design Automation Workshop, 1974, pp. 149-158.

Goldstein, L., "Controllability/Observability Analysis of Digital Circuits", IEEE Trans. on Circuits and Systems, vol. CAS-26, No. 9, Sep. 1979, pp. 685–693.

"On the Acceleration of Test Generation Algorithms," IEEE Trans. Comput., Fujiwara and Shimono, C-32, pp. 1137-1144 (Dec. 1983).

"CONT: A Concurrent Test Generation Algorithm," Takamatsu and Kinoshita, Fault-Tolerant Computing Symp. (FTCS) Digest of Papers, Pittsburgh, Pa., pp. 22-27 (Jul. 1987).

"A Sequential Circuit Test Generation System," Proc. Int. Test Conf., Mallela, et al., Philadelphia, Pa., pp. 57-61 (Nov. 1985).

"An Effective Test Generation System for Sequential Circuits," Proc. Des. Auto. Conf., Marlett, Las Vegas, Nevada, pp. 250-256 (Jun. 1986).

Primary Examiner—Stephen M. Baker
Attorney, Agent, or Firm—Henry T. Brendzel

[57] ABSTRACT

A method for developing a test sequence and for testing manufactured digital circuits. Test vectors are developed based on a simulation-based, directed-search approach. Specifically, from a given test vector, a next test vector is developed by altering the given test vector and determining the utility of the altered trial vector in propagating circuit faults to the primary outputs, based on a simulation of the circuit and a preselected cost function. The vector set is created through an iterative process of altering an accepted test vestor to develop a next trial vector. The vector set is efficiently developed by employing one phase that treats the entire set of circuit faults as the target, followed by another phase that targets specific faults that have not been detected in the previous phase.

2 Claims, 5 Drawing Sheets

COST-FUNCTION DIRECTED SEARCH METHOD FOR GENERATING TESTS FOR SEQUENTIAL LOGIC CIRCUITS

This application is a continuation of application Ser. No. 07/182001, filed on Apr. 15, 1988, abandoned.

BACKGROUND OF THE INVENTION

This invention relates to testing of manufactured circuits, and more particularly, to testing of very large scale integrated circuits. This invention also relates to methods of generating input signal sets for testing complex digital circuits, such as VLSI chips and circuits boards containing SSI, MSI, and VLSI chips.

The advent of large scale integration has brought about enormous complexity to the testing of digital circuits. This complexity is mainly due to the reduction in the ratio of externally accessible points (primary inputs and outputs) to internal, inaccessible, points of the integrated circuit. Carefully selected sequences of input stimuli, known as test vectors, are necessary to check every internal point in the circuit so that the responses observed at the primary outputs when the circuit is faulty are distinctly different from the correct response. While test generation for purely combinational circuits (for which a number of algorithms and heuristics are known) is challenging enough due to the high circuit complexity, sequential circuit test generation poses additional complications because of the memory inherent in such circuits.

The prior art relating to integrated circuit testing can be classified into three broad categories: testing of purely combinational circuits, or of synchronous sequential circuits that were designed with particular "design for testability" techniques; testing of circuits which contain within them the hardware to perform self testing; and testing of general digital (sequential) circuits with test patterns that are externally generated and applied.

In connection with test generation techniques for combinational circuits or for sequential circuits designed for testability (e.g., containing circuitry for separating the circuit into a combinational portion and a memory), a number of methods are known which can be used for test vector generation. These include the well known D algorithm and others.

One of the more recently advanced algorithms is described, for example, in U.S. Pat. No. 4,204,633, issued May 27, 1980 to Goel. This algorithm, known as PODEM, comprises an implicit enumeration scheme for searching the n-dimensional space of primary inputs (the set of all possible input vectors, or signal sets, at the n input ports of the circuit) in order to find a test for a given fault. It has some similarities to the classic D-algorithm, but it differs from it in the sense that fast heuristics are used to truncate the searching process.

The simplest explanation of the PODEM heuristics is as follows. First, it activates a fault at a given node. The circuit is then traced backwards to identify the primary inputs that affect this node. In the process, the path or paths that are easiest to control are selected. A simple heuristic for this is the minimum distance measure from any of the primary inputs to the node in question. This insures that the decision tree search process will terminate quickest along the path in question, and an alternate path can be tried. If at any step, it is found that the current assignment of primary inputs generates a conflict, i.e., the objective cannot be accomplished, alternate choice for the primary inputs is tried until the conflict disappears, which may lead to an identified input signal set as the test for the activated fault, or indicate that the fault is untestable.

The PODEM algorithm has been studied by many researchers and even improved upon, as described, for example, by Fujiwara and Shimono in "On the Acceleration of Test Generation Algorithms," IEEE Trans. Comput. C-32, pp 1137–1144 (December 1983). Still, the test generation process is tedious and results in the testing of less than the complete set of possible faults.

Use of simulators to enhance combinational test generation algorithms has also been proposed. For example, Takamatsu and Kinoshita have proposed the use of simulators in "CONT: A Concurrent Test Generation Algorithm," *Fault-Tolerant Computing Symp.* (FTCS) Digest of Papers, Pittsburgh, Pa., pp. 22–27 (July 1987). In accordance with their approach the PODEM algorithm is used to generate tests for a target fault. Concurrently, all other faults are simulated, and when another fault is found close to being detected, then the target is switched to that fault. The effect of this approach is that one gets a very efficient initial fault coverage. However, because of target switching, some faults may not be tested at all. To circumvent this problem, Takamatsu and Kinoshita suggest switching to "normal" PODEM at the terminal end of the algorithm.

In the Built-In Self-Test (BIST) approaches, the circuit is designed to have a self-test mode. In this self-test mode, a part of the circuit which is specifically designed for this purpose generates test vectors and analyzes the response. The objective is to apply all possible vectors to the combinational part of the circuit. In very large circuits, either the combinational portion is partitioned into independent sections, or the whole circuit is tested by random vectors.

While scan designs (i.e., designs where the memory portion of a sequential circuit can be separated out) and self-test designs have been successfully used in many commercial systems, the extra logic added for testability has performance and cost penalties. These penalties are not always acceptable. A majority of VLSI chips manufactured today, consequently, contain neither the scan hardware nor the built-in self-test capability. Tests for these chips, as well as for many systems built with these chips, can not be generated by the algorithms described above.

Most test generators for sequential circuits have been developed on a common principle that can be summarized as follows. A combinational model of the circuit is constructed by regenerating the feedback signals from the previous-time copies of the circuit. Thus, the timing behavior of the circuit is approximated by combinational levels. Topological analysis algorithms that activate faults and sensitize paths through these multiple copies of the combinational circuit are used to generate tests. A test generator using this technique is reported by Mallela et al. in "A Sequential Circuit Test Generation System," Proc. Int. Test Conf., Philadelphia, Pa. pp. 57–61 (November 1985), and Marlett in "An Effective Test Generation System for Sequential Circuits," Proc. Des. Auto. Conf., Las Vegas, Nev., pp 250–256 (June 1986).

There are two basic problems with the above approach. First, the expansion of a sequential circuit into a combinational circuit results in increased complexity and increased memory requirements. Since each copy of the circuit represents one time frame (or vector), the complexity of tested circuits is quite limited because of the inevitable memory limitations (i.e., the number of time frames that are handled is limited). This restriction can make many testable faults "out-of-bounds" for the test generator. The second problem results from the inability of test generation algorithms to consider the timing behavior of gates. Thus, the tests can cause races and hazards in the circuit. Because of these two problems, most test generators developed on the above principles, can perform reasonably well only on circuits with up to 1,000 gates.

While most present day test generators employ the combinational model and time frame method, simulation-based methods for sequential circuits have also been reported. One method, described by Snethen in, U.S. Pat. No. 3,961,250, issued Jun. 1, 1976, constructs tests by tracing backward through the circuit in much the same way as performed in a combinational test generator, but all forward signal propagation is carried out by an event-driven simulator. This method is effective for circuits of moderate complexity (few hundred gates), but the backtracking restricts its use for very large circuits.

SUMMARY OF THE INVENTION

The prior art limitations are overcome with the present invention which takes a simulation-based, directed-search approach to generating tests for digital circuits. From a given test vector, a next test vector is developed by altering the given test vector and determining the utility of the altered trial vector in propagating circuit faults to the primary outputs, based on a simulation of the circuit and a preselected cost function. The vector set is efficiently developed by employing one phase that treats the entire set of circuit faults as the target, followed by another phase that targets specific faults that have not been detected in the previous phase.

DETAILED DESCRIPTION

Figure 1:
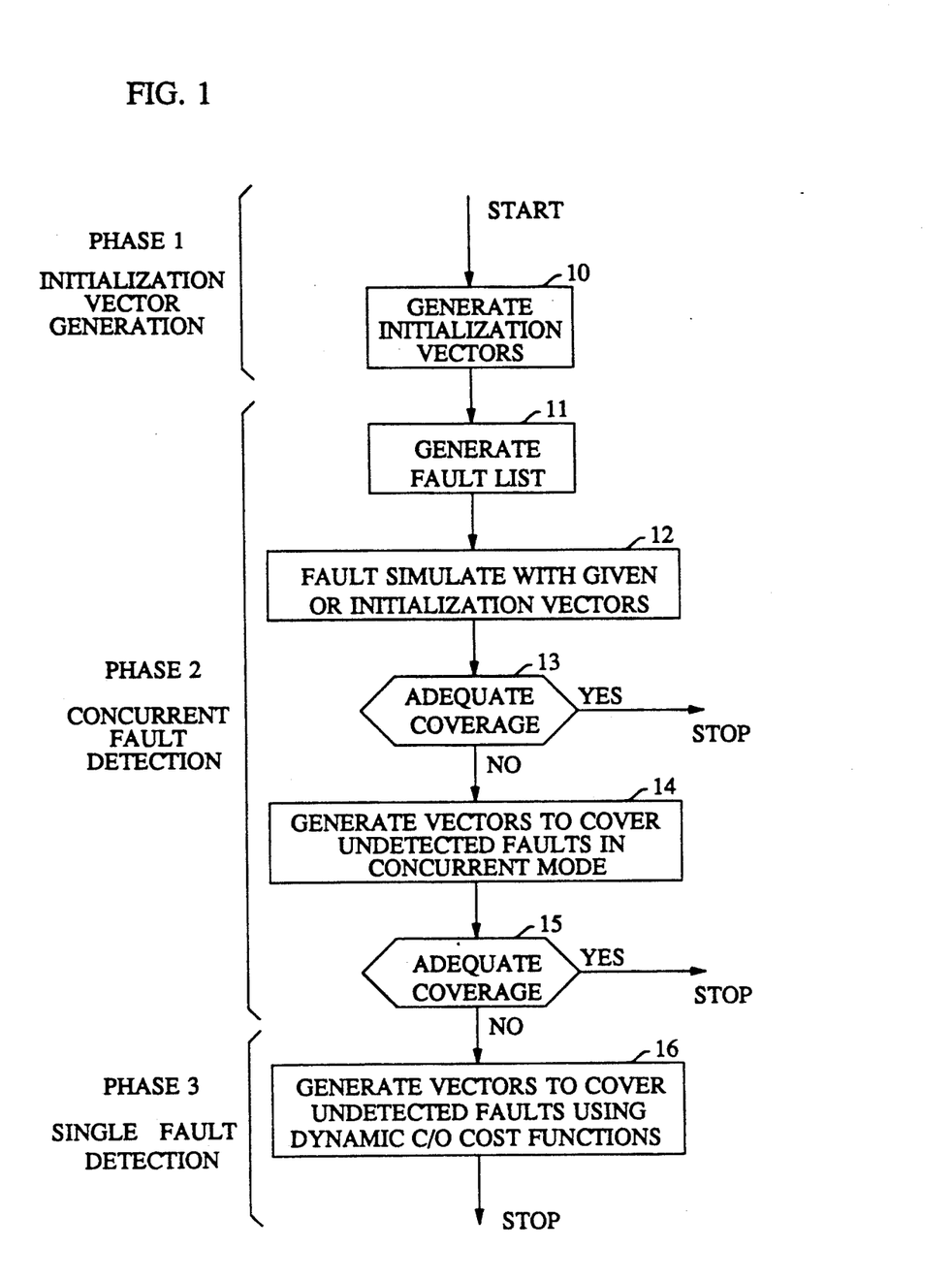
FIG. 1 presents a general block diagram depicting the process of developing a sequence of input signals for testing the operational integrity of a given circuit.

FIG. 1 presents a basic flow chart of the test generation process of this invention, which can be viewed to comprise three phases. In the first phase comprising block 10, initialization vectors are generated which bring the circuit to a known state irrespective of its starting state. A vector, in the context of this disclosure, is a set of input signals to be applied to the external inputs of the circuit. If designer-supplied initialization vectors are available, or if the circuit has hardware features for automatic initialization, then Phase 1 can be skipped and block 10 performs no work.

Phase 2, which is the concurrent fault detection phase, begins with the initialization vectors that are either supplied by the designer or generated in Phase 1. Supplied vectors may comprise more than merely the set of vectors necessary for initialization of the circuit. The fault coverage analysis process of Phase 2 begins with a fault list being generated within block 11. The fault list, which may be generated in a conventional manner, contains all single "stuck at" faults or a subset of such faults. All faults in this list are simulated in block 12 using a conventional fault simulator. The coverage of the potential tests is analyzed in block 13 and, if it is determined that the fault coverage is adequate (exceeds a preselected percentage of all possible faults), then the test generation stops. Otherwise, additional tests are generated by the blocks following block 13, with all undetected faults as targets. Of course, unless the set of vectors available for simulation by block 12 is substantial, it is unlikely that the attained coverage will be adequate. In such a circumstance, the process beyond block 13 may be easily dispensed with.

Within Phase 2, following tests generated by block 14, block 15 determines whether the fault coverage resulting from the tests added by block 14 has reached the required level. If the fault coverage is sufficient, then the process stops. Otherwise, still additional tests are created in Phase 3, within block 16. In Phase 3, test vectors are generated for single fault targets. The test vector generation is guided by dynamically computed controllabilities and observabilities. The following discussion, together with FIGS. 2-4, describes our test generation process in greater detail.

Phase 1—Initialization

Figure 2:
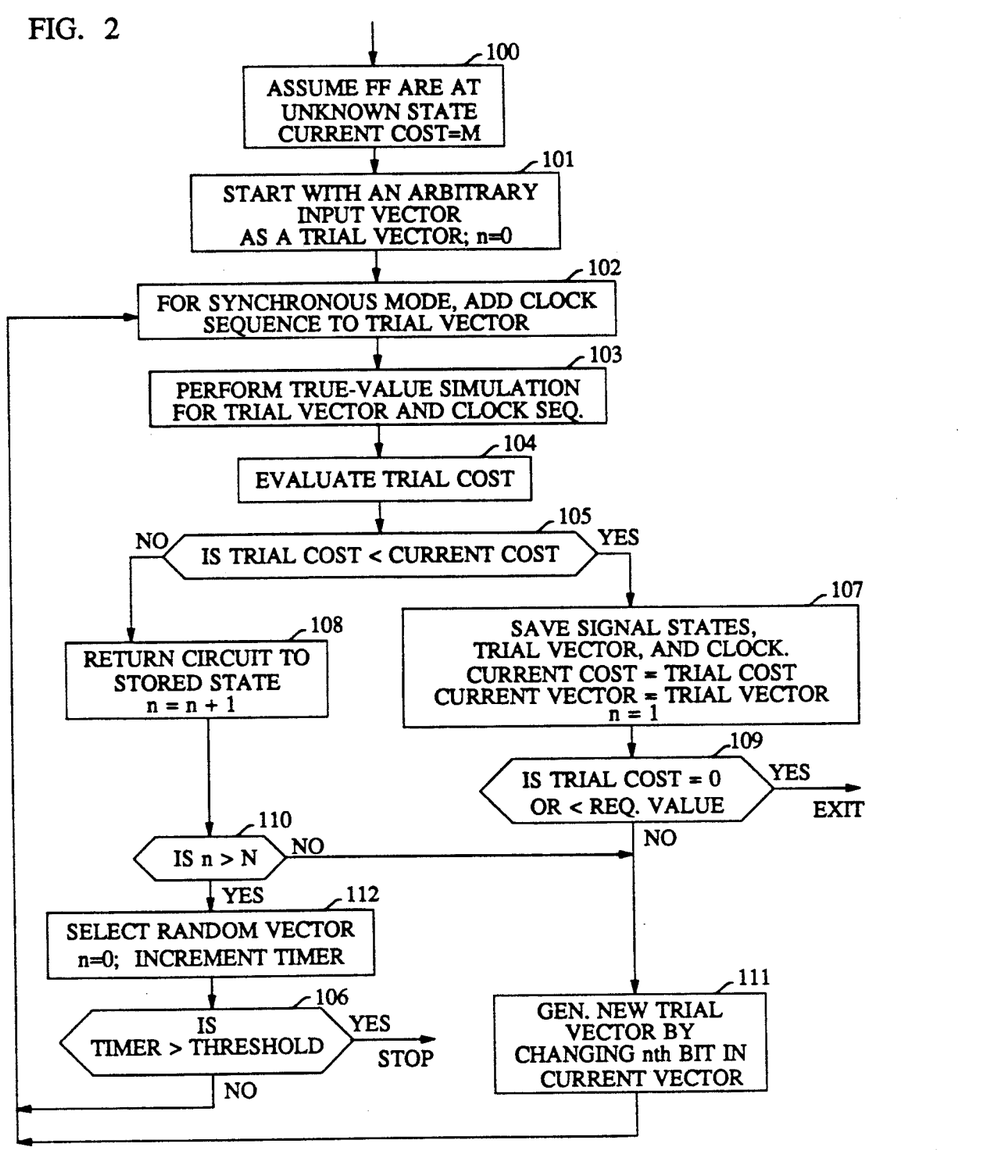
FIGS. 2-4 depict the various process phases described in FIG. 1.

Referring to FIG. 2, the process of generating initialization vectors requires a simulator for the fault-free circuit. Such a simulator may be a computer program that accepts the circuit connectivity data and, for any given input stimulus vector, computes the output states of all gates in the circuit (for example, it may compute the output states for a digital circuit in terms of 0, 1, or unknown—usually denoted by X). A combinational circuit is considered to be fully initialized if none of its gates are in the "unknown" state. This is accomplished with a single input vector, since all outputs in a combinational circuit are fully determined for any input signal set. A sequential circuit on the other hand, is fully initialized when all its memory elements are in known states. One has to provide a set of initialization vectors to bring a circuit to a known state, and those initialization vectors must be chosen appropriately. In accordance with our preferred embodiment, the initialization vectors are generated by a procedure that minimizes a "cost function". We chose our cost function to correspond to the number of flip-flops in the "unknown" state, but other cost functions are also possible.

As shown in the flow chart of FIG. 2, the initialization process begins at block 100 with the assumption that all flip-flops are at the "unknown" state, and the cost function is simply equal to the number of flip-flops in the circuit, M. The process of selecting a set of initialization vectors consists of generating "trial vectors" and accepting only those trial vectors that reduce the cost.

To start the vector selection process, block 101 selects a trial vector and sets variable n to zero. This selected vector may be randomly generated or user-supplied. Variable n is used, in accordance with our invention, to generate a next trial vector from the most recently accepted trial vector, by reversing the bit at position n of the accepted vector. The variable n, can thus assume any value in the range 1 to N, where N is the number of external inputs available for the circuit under consideration.

When dealing with synchronous circuits, the user supplies the sequence of clocks that is to be applied, and that is done in block 102. Starting from saved states of the circuit (which initially is merely the set of all X's), block 103 performs the true value simulation for the trial vector and the given sequence of clock signals (i.e., the simulations of a "good" circuit). During simulation, the input data bits are kept fixed while the given clock sequence is applied.

After simulation, block 104 computes a "trial cost" measure by counting the number of flip-flops that remained in the unknown state after application of the trial vector. The computed trial cost is compared to the previously accepted current cost in block 105. If the trial cost is lower than the previously accepted current cost (indicating that the trial vector has initialized some flip-flops that were previously in the unknown state), then block 107 saves the new state of the circuit, the trial vector, and the clock sequence, and sets n to 1. The current vector is also set to the trial vector, and the current cost is set to the trail cost. Otherwise, block 108 returns the circuit to its last stored state and n is incremented by one. The signal states of the circuit are saved in block 107 so that, if necessary at the next iteration, the circuit can be returned to the state it came from if the next trial vector is not accepted.

Proceeding along the branch of block 107, block 109 compares the newly accepted current cost to zero (which would indicate that no memory elements are left in an unknown state) or to whatever minimum acceptable cost is set by the user. While the cost condition is not reached, the initialization phase continues by proceeding to block 111.

As indicated above, block 108 is executed when the cost is not reduced with the trial vector. Block 110 compares the value of variable n (as incremented in block 108) to N, which is the number of external, non-clock, inputs of the circuit. When n exceeds N, the progression of developing test initialization vectors from the vector initially made available to block 102 is terminated, and control passes to block 112. Otherwise, control passes to block 111.

In block 111, a new trial vector is generated by reversing the $n^{th}$ bit of the current trial vector. Control then passes to block 102, which leads to a simulation of the circuit's response to the new trial vector. Reaching block 112 corresponds to reaching a "local minimum", which is a common phenomenon in many directed-search methods. Some possible ways of getting away from a local minimum are to try multiple (2, 3, etc.) bit changes in the current vector, or to restart with a new randomly selected current vector. One could continue looping through until all flip flops are set. But, one would rarely wish to select new vectors without regard to the computation costs (e.g., one would not wish to have a simulation that costs more than the budget would allow). Hence, while block 112 selects such a new trial vector and resets n to zero, it also increments a counter, and passes control again to block 106. Block 106 evalutes whether the counter has exceeded a preselected threshold value, if it has, no new vectors are selected and the process terminates with an error message.

Phase 2—Concurrent Fault Detection

Figure 3:
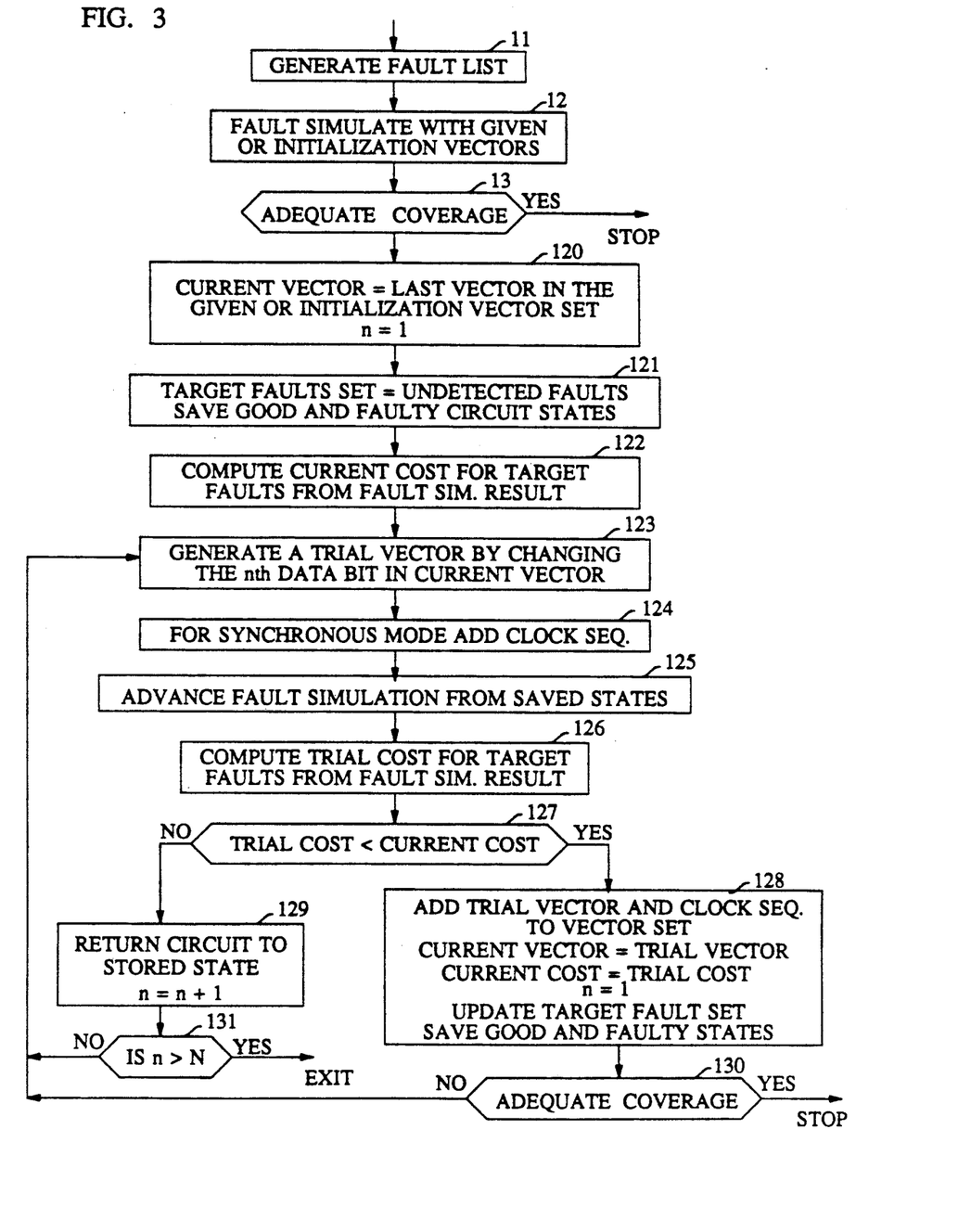

Phase 2, depicted in FIG. 3, begins with the initialization vectors and a list of faults generated in block 11. Block 12 performs simulation, and it identifies the faults in the list that are detected with the initialization or the supplied vectors. The concurrent fault simulator employed can be, for example, the one described by E. G. Ulrich and T. Baker in, "Concurrent Simulation of Nearly Identical Digital Networks", Computer, Vol. 7, pp. 39-44, April 1974. The faults detected by the initialization vectors are removed from the fault list. Subsequently, if block 13 is employed, it determines whether the fault coverage is adequate. If the coverage after simulation with the given vectors is not adequate, then in accordance with our illustrative embodiment the last vector in the set of vectors used by block 12 is designated as the "current vector" in block 120 and variable n is set to 1. The "target fault set" is arranged in block 121 to comprise all the faults that are undetected at this point, saving all "good" and "faulty" states (available in the concurrent fault simulator). Block 122 computes the current cost for each fault in the target fault set. We define the cost of a fault as the shortest distance from any "fault effect" of that fault to any primary output. The distance here is simply the number of logic gates on the path. This way, the smaller the cost, the closer the fault is to being detected. When a fault is detected, its cost is zero. Other cost functions can also be defined.

Generation of trial vectors is performed in a manner that is generally similar to the one employed in the initialization phase. Specifically, block 123 generates a trial vector by reversing the $n^{th}$ bit of the current vector block 124 supplies the clock sequence, block 125 simulates the application of the trial vector on the current state of the circuit, and block 126 computes the cost function of the target faults resulting from the simulation. Block 126 differs somewhat in its operation from block 104, in two respects. The first difference is that in Phase 2 a cost is maintained for each of the faults in the target fault set. Thus, the search for test vectors is guided by a group of faults instead of a single target. Relatively simple rules, however, can be applied in this situation, as, for example, one rule may be to accept a trial vector if it reduces the sum of costs for the 10% of the lowest cost undetected faults. The second difference is in the way flip-flops are treated. When the flip-flops are described as interconnection of logic gates, then the cost computation simply requires counting of gates along a path. But, when the flip-flops are modeled as functional primitives, then each flip-flop may be treated as a pseudo-primary output. We, in essence, create levels in the circuit, and assign flip-flops to particular levels, based on the circuit topography. Thus, primary outputs are said to be at level 0. Flip-flops feeding into primary outputs only through combinational logic are said to be at level 1. Flip-flops feeding into combinational logic that does not drive primary outputs but feeds into level 1 flip-flops, are said to be at level 2 flip-flops, and so on. Since a fault can propagate to elements of different levels, each fault can have a number of costs. We define the cost of a fault as the weighted sum of its costs at the primary output and the various pseudo-outputs. We also assign larger weights to higher levels of pseudo outputs. For example, the weight factor for cost at a primary output (level 0) can be 1, while the weight factor at level 1 pseudo output can be 10, the weight factor at level 2 pseudo output can be 100, etc. In this manner, faults that can be quickly detected at a primary output result in a lower cost.

Also as in FIG. 2, when the trial cost is lower than the current cost, block 127 passes control from block 126 to block 128 where the trial vector and the clock sequence are saved, the current vector is set to the trial vector, the current cost is set to the trial cost, the target fault set is updated and the "good" and "faulty" states are saved. The variable n is set to 1, and control passes to block 130. Block 130 determines whether the fault coverage is adequate. If it is, the process stops. Otherwise, control passes to block 123.

When the trial cost is not lower than the current cost, control passes to block 129 where n is incremented by one and the system is reset to its previous, saved, state. Following clock 129, block 131 determines whether the variable n has reached the value N. While n is not greater than N, control passes to block 123. When n is greater than N, the concurrent phase terminates since all single bit changes in a current vector produce no cost reduction. This will normally happen with only a small number of faults being left in the target set. The test vectors for these faults sparsely populate the vector space and, therefore, the collective cost function does not provide any significant guidance. Also, the cost for a fault can not be computed if it is not activated. Since the cost is based on fault effects, the cost measure per se is useless in guiding the process toward activation of a fault.

Phase 3—Single Fault Detection

Figure 4:
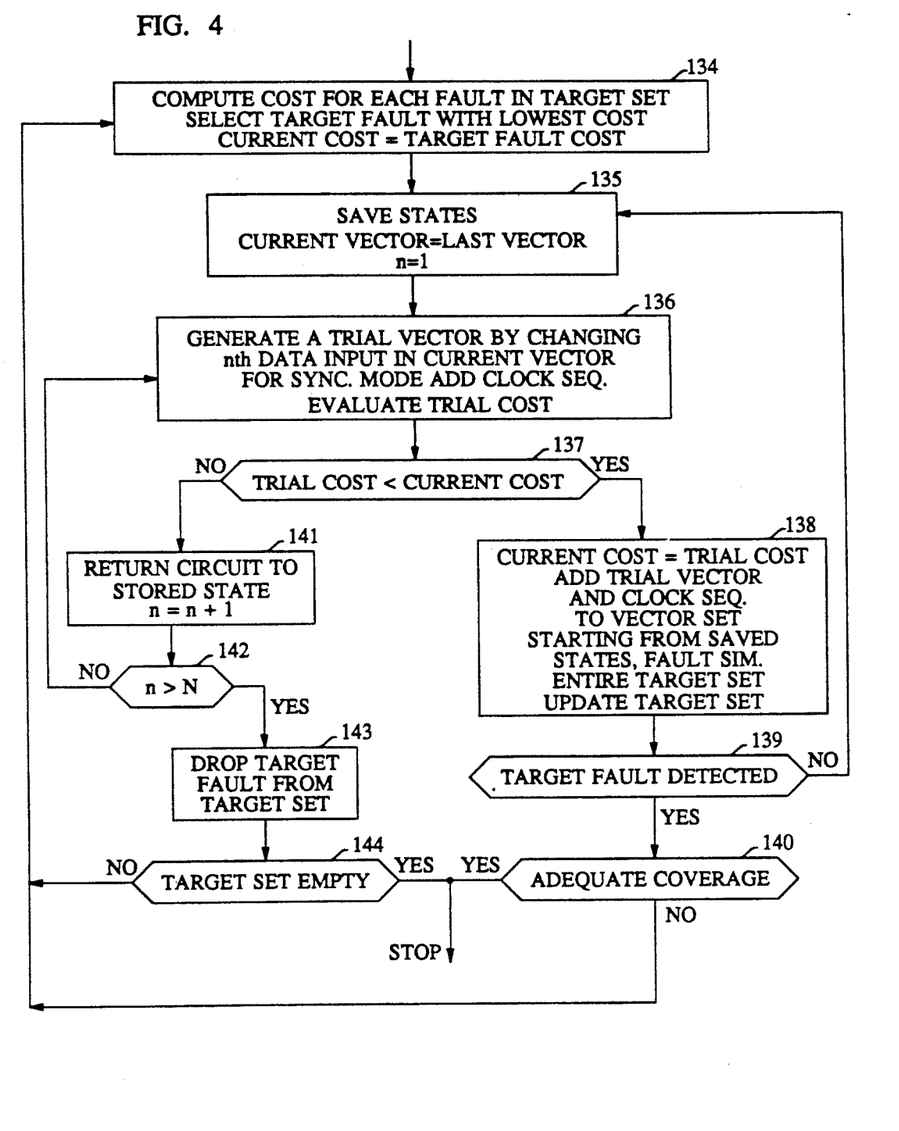

This phase, as shown in FIG. 4, has two major differences from Phase 2. First, it uses a "good" circuit simulator for trial vector simulation and cost computation, and after a trial vector is accepted, fault simulation is done for all remaining faults before starting the next trial. The second difference is in the computation of the cost that is derived for a single target fault.

The cost computation in this phase is based on a SCOAP-like testability measure. SCOAP, as described by L. H. Goldstein in "Controllability/Observability Analysis of Digital Circuits," *IEEE Trans. on Circuits and Systems*, Vol. CAS-26, pp. 685–693, September 1979, is an algorithm for computing quantities for every node that are related to the effort of (a) controlling from the primary inputs, and (b) observing at a primary output. These quantities, or measures, are computed from the circuit topology and without consideration of any specific input vectors. They are, therefore, referred to as static testability measures.

In connection with our test generation task, we need to evaluate controllabilities and observabilities for a current vector and then determine how these quantities would be changed by a trial vector. Therefore, in accordance with our invention we compute the measure dynamically rather than statically, always relative to the current state. Also, the dynamic testability measure is used only to compare the suitability of two vectors for detecting a target faults; i.e., the testability measure is not used in an absolute sense to assess the testability of the circuit.

We define DC1(i) as the dynamic 1 controllability cost of a node i. Its value is related to the minimum number of primary inputs that must be changed and the minimum number of additional vectors that are needed to force the value of node i to 1. Similarly, DC0(i) is the dynamic 0 controllability cost of node i.

More specifically, when the current logic value on node i is 1, then DC1(i) is defined as:

$$DC1(i)_{V(i)=1} = 0.$$

V(i)=1 reflects the condition that the logic value on node i is 1. Similarly, $$DC0(i)_{V(i)=0} = 0.$$

The above definition pair follows from the fact that no input change is needed to force a 1 or a 0 on a node when its value is already at that state. Under other conditions, DC1(i) and DC0(i) will of course assume non-zero values. For example, for the output line i of an AND gate with m inputs, DC1(i) and DC0(i) are computed as:

$$DC1(i)_{[V(i)=0 \text{ or } X]} = \sum_{j=1}^{m} DC1(k_j)$$

$$DC0(i)_{[V(i)=1 \text{ or } X]} = \min_{1 \leq j \leq m} DC0(k_j)$$

where $k_j$ is the $j^{th}$ input line of the gate and "min" refers to the minimum of a set of quantities.

For sequential elements, the cost function is somewhat different, and is intended to reflect the desire to give sequential elements a heavier weight. Accordingly, the dynamic controllabilities for a flip-flop output i are defined as:

$$DC1(i)_{[V(i)=0 \text{ or } X]} = DC1(d) + K$$

$$DC0(i)_{[V(i)=1 \text{ or } X]} = DC0(d) + K$$

where d is the input data signal of the flip-flop and K is a large constant, say, 100.

In order to detect a stuck fault, the test generator must first find a sequence of vectors to activate the fault, i.e., set the appropriate value (opposite to the faulty state) at the fault site and then find another sequence to sensitize a path to propagate the fault effect to a primary output. Thus, the cost function should reflect the effort needed to activate and propagate the fault. The activation cost, $AC(i_u)$, of node i stuck-at-u fault is $DC\alpha(i)$ where $\alpha = u$. This follows from the consideration that the cost of activating a stuck-at-0 or a stuck-at-1 fault is the cost of setting up the opposite logic level at the fault site.

The propagation cost is basically the dynamic observability measure. When the signal at node i fans out and is applied to n branches, the propagation cost is chosen as the minimum of the set of propagation costs via the different branches to a primary output;

$$PC(i) = \min_{1 \leq j \leq n} PC(i_j)$$

where $i_j$ is the $j^{th}$ fanout branch of i. For an input signal $i_u$ of an AND gate whose output signal is i, we have $$PC(i_u) = PC(i) + \sum_{\substack{1 \le j \le n \\ j \ne u}} DC1(ij)$$

where j designates input leads, u is the input lead that carries the input signal $i_u$, and n is the number of inputs of the AND gate. What this equation states is that to propagate a signal through input lead u of an AND gate whose own propagation cost is PC(i), one has to add to PC(i) the cost of controlling all other inputs of the gate.

The cost function for test generation for a single target fault is defined in terms of the activation cost and propagation cost defined above. For an undetected fault F, line i stuck-at-$\alpha$, that is not activated, the cost is defined as:

$$\text{Cost}(F)_{[F \text{ not activated}]} = K1 \times AC(i_\alpha) + PC(i)$$

Where K1 is a large constant that determines the relative weighting of the two factors. If the fault has been activated, and $N_F$ is the set of the nodes where the fault effect appears, then $\text{Cost}(F)_{[F \text{ activated}]} =$ $$\text{Cost}(F)_{[F \text{ activated}]} = \min_{i \in N_F} PC(i)$$

Notice that in this cost function reconvergent fanouts are ignored. This provides computational simplicity, but may occasionally result in the failure to detect a fault.

The above paragraphs describe the cost function that we employ in the third phase, where the number of remaining undetected faults is relatively small and where we concentrate on specific faults in an effort to activate and detect them. The following describes the actual vector selection procedure, depicted in FIG. 4, which follows closely the approach employed in connection with the previous phases.

Thus, in FIG. 4, block 134 is entered first, where a cost is computed for each of the faults remaining in the target set. The cost computation, which employs the last vector accepted as the current vector in Phase 2, may follow the definitions disclosed above, but other cost measures can also be employed. Having evaluated the various costs, the fault having the lowest cost is selected as the target fault of the current iteration, and that lowest cost is defined as the current cost. Following the process of block 134, block 135 saves the state of the circuit, sets the current vector as the last vector, and sets n to 1. Block 136 creates a new trial vector by reversing the $n^{th}$ bit of the current vector, adds the appropriate clock sequencing signals, and computes a trial cost based on the trial vector. Block 137 determines whether the trial cost is lower than the current cost and, when it is, control passes to block 138. Block 138 accepts the trial vector, updates the current cost as the trial cost, evaluates the effect of the accepted trial vector on the other faults, and updates their status. Some of those other faults may, for example, be detected and accordingly be removed from the target list. Following block 138, block 139 ascertains whether the target fault has been detected. If it was not detected, control returns to block 135. If the fault is detected, control passes to block 140 where it is evaluated as to whether an adequate level of fault coverage has been reached. When it is reached, the process stops; but until then, the process returns to block 134 for selection of a new target fault.

When the trial cost is found in block 137 to be not lower than the current cost, then the trial vector cannot be accepted. The circuit is returned to its previous state in block 141 and n is incremented by 1. Thereafter, block 142 determines whether n has exceeded N, which is the number of primary inputs of the circuit under consideration. When that number is exceeded, control passes to block 143 where the fault is dropped from further consideration (considered potentially undetectable), and block 144 is entered. Prior to n exceeding N, control returns from block 142 to block 136 to try another trial vector. Lastly, block 144 ascertains whether the target set is empty. When it is, the process stops.

Although to this point the disclosure addresses primarily the issue of how to generate test vectors efficiently to permit both combinational and sequential circuits to be tested, it is clear that our invention concerns itself most with the process of testing actual circuits. This testing occurs during the design stage when the circuit design is evaluated, and even more so during the manufacturing stage when quality assurance suggests that circuits should be tested before being offered to a customer.

The end product of our invention is a manufactured circuit that is improved over the prior art circuits in that it is more likely to be fault-free. Such circuits are more desirable to the customer and can command a higher price.

Figure 5:
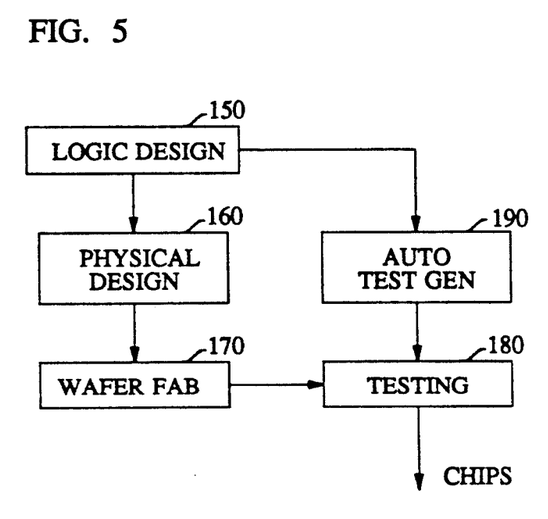
FIG. 5 shows the general procedure and structural outline for employing the test sequence of this invention in the design and manufacture of circuits.

FIG. 5 presents a block diagram of the process through which large VLSI chips, for example, are realized in accordance with the principles of our invention. It includes a logic design block 150, a physical design block 160 which follows the logic design, and a subsequent wafer fabrication block 170. A test block 180 follows, which is responsive to block 170 and to automatic test generator block 190.

Block 150 represents the design effort. The output of this block is a specification of the circuit that is to be manufactured. This specification is supplied to the physical design block and to the automatic test generator block. The physical design block develops the layouts and prepares the masks (in the case of integrated circuits), and applies its product to the wafer fabrication block. The automatic test generator block develops the appropriate test signal sequence in accordance with the principles of our invention.

While in the design stage, sample wafers are manufactured in block 170, and applied to testing block 180. The test sequence developed in block 190 is applied to the manufactured circuit and the output is observed. When an error is consistently observed, the design of the circuit can be checked to insure that no design error has been introduced in the physical design block.

During the manufacturing stage, only blocks 170, 180, and 190 are active. Testing is performed on the manufactured circuits and the fault-free circuits are realized.

Figure 6:
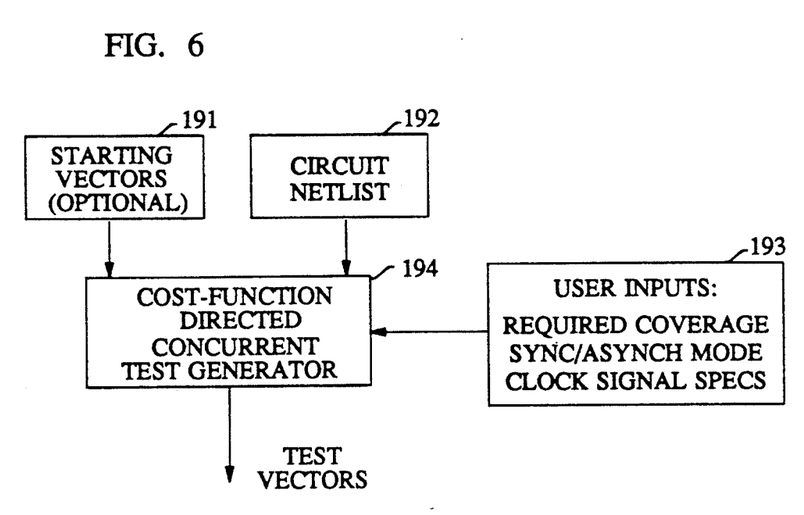
FIG. 6 broadly illustrates the process and apparatus for developing the test sequence in accordance with the principles of this invention.

FIG. 6 depicts a block diagram that generally describes the process of developing the test vectors as well as the apparatus for developing the test vectors. Specifically, to develop the test vectors that are required for testing a given circuit, the practitioner is required to provide a circuit description and, optionally, a set of starting vectors. This is illustrated in FIG. 6 by blocks 191 and 192. Also, it is useful to indicate the desired level of fault coverage because, sometimes, less than 100% coverage is acceptable and, in such circumstances, it would be wasteful to expend a lot of effort to provide a greater level of coverage. To that end, block 193 shows the user's input as to the required fault coverage and whether asynchronous or synchronous operation is expected of the circuit. In case of the latter, the clock sequence must, of course, be specified. In response to the information provided by blocks 191, 192, and 193, block 194 executed the process of identifying a sequence of input signals for testing the circuit under consideration. Block 194 executes the process described above in connection with FIGS. 1-4. The output of block 194 are the test vectors used in the process and system depicted in FIG. 5.

We claim:

1. A method for manufacturing a sequential circuit comprising
   a step of fabricating said circuit; and
   a step of testing the operational integrity of said circuit with a test comprising a sequence of input signals created through iterative use of a simulation of said circuit with a cost-directed process of selecting signal members of the sequence in accordance with a distance measure that, when no signal that creates a fault effect at a circuit output can be determined, selects for inclusion in said sequence the signal which creates a fault effect having a non-zero distance to any of the circuit outputs, that is not longer than the distance to an output of the circuit of any other fault effect created by other signals due to any of the given faults within the circuit simulation.

2. The method of claim 1 wherein said test further comprises:
   a sequence of presetting signals, to preset said circuit to a known state, where the presetting signals are selected through an iterative process of circuit simulation with trial presetting signals, and where at each iteration a trial presetting signal is selected for inclusion in the sequence of presetting signals when a cost measure that reflects the progress of setting the memory states in the circuit is improved; and
   a sequence of addendum signals that are selected through an iterative process of selecting a circuit fault to be detected, simulating the circuit's response to trial addendum signals, and where at each iteration a trial addendum signal is selected for inclusion in the sequence of addendum signals when a cost measure that reflects the effect of the progress of the selected fault toward the primary outputs of the circuit is improved.

* * * * *